(12) United States Patent
Golshan (10) Patent No.: US 6,662,325 B1
(45) Date of Patent: Dec. 9, 2003

(54) APPARATUS FOR ON-LINE CIRCUIT DEBUG USING JTAG AND SHADOW SCAN IN A MICROPROCESSOR (75) Inventor: Farideh Golshan, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 516 days.

(21) Appl. No.: 09/680,238

(22) Filed: Oct. 5, 2000

(51) Int. Cl.[7] .............................................. G01R 31/28
(52) U.S. Cl. ........................ 714/726; 714/727; 714/729
(58) Field of Search ................................. 714/729, 726, 714/35, 731, 727; 326/16

(56) References Cited

U.S. PATENT DOCUMENTS

| | | | | |
|---|---|---|---|---|
| 5,054,024 A | * | 10/1991 | Whetsel | 714/726 |
| 5,056,093 A | * | 10/1991 | Whetsel | 714/729 |
| 6,060,907 A | | 5/2000 | Vishwanthaiah | 326/87 |
| 6,131,171 A | * | 10/2000 | Whetsel | 714/35 |
| 6,185,711 B1 | * | 2/2001 | Leung et al. | 714/731 |
| 6,380,724 B1 | | 4/2002 | Mahurin et al. | 324/73.1 |
| 6,496,030 B1 | * | 12/2002 | Kaneko | 326/16 |

* cited by examiner

Primary Examiner—David Ton
(74) Attorney, Agent, or Firm—Gunnison, McKay & Hodgson, L.L.P.; Philip J. McKay (57) ABSTRACT A series of secondary or "shadow" storage elements are employed that duplicate, or "shadow", the information in a circuit's core logic primary storage elements. These shadow storage elements are then coupled to form a separate, independently-addressable shadow scan path. The information contained in the primary storage elements is then scanned out via the shadow scan path without altering the primary storage elements using special commands issued from a JTAG controller. This shadow scan system allows a circuit to remain operational while a snapshot of the core logic information is scanned out.

22 Claims, 6 Drawing Sheets

APPARATUS FOR ON-LINE CIRCUIT DEBUG USING JTAG AND SHADOW SCAN IN A MICROPROCESSOR

FIELD OF THE INVENTION

The present invention relates generally to circuit testing, and, more particularly, to an apparatus for circuit testing that allows the circuit to be debugged while the circuit continues to perform normal circuit operations in the microprocessor.

BACKGROUND OF THE INVENTION

Advances in technology, such as the development of complex circuits including integrated circuits (ICs) and microprocessors, particularly surface mounted ICs and microprocessors have made traditional circuit testing methods extremely difficult. One prior art approach for testing complex circuits was to employ the Joint Test Action Group (JTAG) standard, which was developed by an international group of electronic manufacturers. The JTAG standard has been adopted by the Institute of Electrical and Electronic Engineers (IEEE) as IEEE Standard 1149.1-1990, IEEE Standard Test Access Port and Boundary-Scan Architecture (the "IEEE standard"), the contents of which are hereby incorporated in their entirety by reference.

In the prior art, the JTAG standard was typically used for boundary scan testing. Boundary scan testing allowed for testing based on a circuit's inputs and outputs, i.e., at the boundaries, but did not provide for testing of the core logic of a circuit or microprocessor.

The JTAG standard was occasionally used in the prior art to perform tests of the core logic of an IC. However, when the JTAG standard was used in the prior art to perform these tests, the tests were invasive because data was entered or outputted serially from one storage element to another. When the test data was entered or outputted serially from one storage element to another using prior art methods, the data originally contained in those storage elements was altered by the process. As a result, prior art testing of core logic using the JTAG standard typically required that the circuit, IC or microprocessor be taken out of normal operation within a system and run in a special test mode. These prior art methods resulted in the circuit not being tested during normal operation. Consequently, the data received did not test the circuit during actual system operation.

What is needed is a method and apparatus that allows for circuit debug while the circuit, IC or microprocessor remains on-line and continues to perform normal circuit operations.

SUMMARY OF THE INVENTION

In one embodiment of the invention, a circuit includes at least one functional unit. The functional unit includes a primary scan path and a shadow scan path. The shadow scan path receives data contained in the primary scan path and scans the data out of the functional unit for testing the operation of the circuit while the circuit continues its normal operations.

Thus, in accordance with the present invention, a series of secondary or "shadow" storage elements that duplicate, or "shadow", the information in the core logic's primary storage elements are employed. These shadow storage elements are then connected together to form a separate, independently-addressable scan path (the secondary or "shadow" scan path). The information contained in the primary storage elements is then scanned out via the shadow scan path without altering the primary storage elements using special commands issued from a JTAG controller. This shadow scan system allows a circuit to remain operational while a snapshot of the core logic information is scanned out.

As discussed in more detail below, the apparatus of the present invention allows for access to the internal states of the microprocessor while the microprocessor continues to operate in a system. This is accomplished by capturing the contents of the functional primary storage elements into the shadow storage elements and then shifting the captured value out of the microprocessor without interrupting normal circuit operation. This is in direct contrast to prior art methods which either tested only at the boundaries, i.e., at the inputs and outputs of the circuit, or that required the microprocessor to be run in a special test mode. In addition, using the structure of the invention, real operating data is obtained from the microprocessor. This again is in direct contrast to the prior art methods where only data from special test mode operations could be obtained.

The structure of the present invention uses the JTAG standard and takes advantage of the separate JTAG clock (TCK) to manipulate the capture and shift operations of the shadow scan path using specially designed JTAG signals. In addition, using the structure of the invention, the shadow scan paths are not part of the microprocessor internal scan chain.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1A:
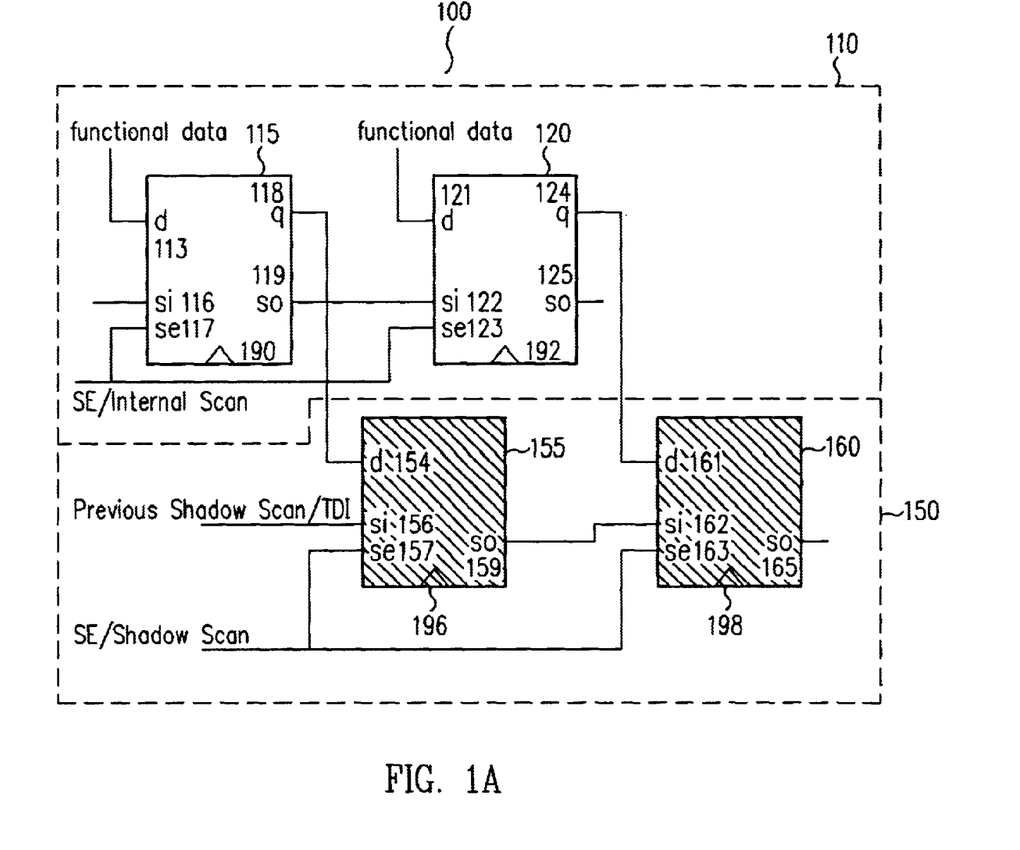
FIG. 1A shows a simplified diagram of a shadow scan configuration in accordance with the present invention.

FIG. 1A shows a simplified diagram of a shadow scan configuration 100 in accordance with the present invention including the important connections between elements. Primary storage elements 115 and 120 receive functional data at their respective "d" inputs 113 and 121. The "q" outputs 118 and 124 of primary storage elements 115 and 120, respectively, are coupled to the "d" inputs 154 and 161 of secondary or "shadow" storage elements 155 and 160, respectively. In one embodiment of the invention, the Scan Out (so) output 119 of primary storage element 115 is coupled to the Scan In (si) input 122 of primary storage element 120 to form primary scan path 110. Likewise, the "so" output 159 of shadow storage element 155 is coupled to the "si" input 162 of shadow storage element 160 to form a secondary or "shadow" scan path 150.

In one embodiment of the invention, primary storage elements 115 and 120 are edge-triggered flip-flops with a data input ("d") and a clock input ("CK"), such as D-type flip-flops and shadow storage elements 155 and 160 are edge-triggered flip-flops with two data inputs, a Select ("se") input, a clock-enable ("CE") input, and a clock input ("CK"), such as mux-2 D-type flip flops with clock enable. Shadow storage elements 155, 160 receive data from primary storage elements 115, 120 via the "d" inputs 154 and 161, respectively, and receive data from preceding shadow storage elements via the si inputs 156, 162, respectively.

For simplicity, in FIG. 1A, only two primary storage elements 115 and 120 are shown and only two shadow storage elements 155 and 160 are shown. In actual practice there could be any number of primary storage elements 115 and 120 and shadow storage elements 155 and 160 that a given application of the invention required. In one embodiment of the invention, all the primary storage elements 115 and 120 are substantially connected as shown in FIG. 1A to form a primary scan path 110 and all the shadow storage elements 155 and 160 are substantially connected as shown in FIG. 1A to form a shadow scan path 150, regardless of the number of elements employed.

Typically, primary scan path 110 includes more than two storage elements 115 and 120 and shadow scan path 150 includes more than two shadow storage elements 155 and 160. Consequently, primary storage element 115 includes a "si" input 116 for coupling to a preceding primary storage element (not shown) and primary storage element 120 includes a "so" output 125 for coupling to a following primary storage element (not shown). Likewise, shadow storage element 155 includes a "si" input 156 for coupling to a preceding shadow storage element (not shown) and shadow storage element 160 includes a "so" output 165 for coupling to a following shadow storage element (not shown).

In addition to the elements discussed above, primary storage elements 115 and 120 include Scan Enable (se) inputs 117 and 123, respectively, and CLK inputs 190 and 192, respectively. Likewise, shadow storage elements 155 and 160 include "se" inputs 157 and 163, respectively, and CLK inputs 196 and 198, respectively.

The signals received at se inputs 157 and 163 are, according to the invention, special signals generated by a JTAG controller 130 (FIG. 1B) which control the data out of primary storage elements 115 and 120 and into shadow storage elements 155 and 160. The signals generated on se inputs 157 and 163, as well as the clock generating the signal on CLK inputs 196 and 198 are discussed in more detail below.

Figure 1B:
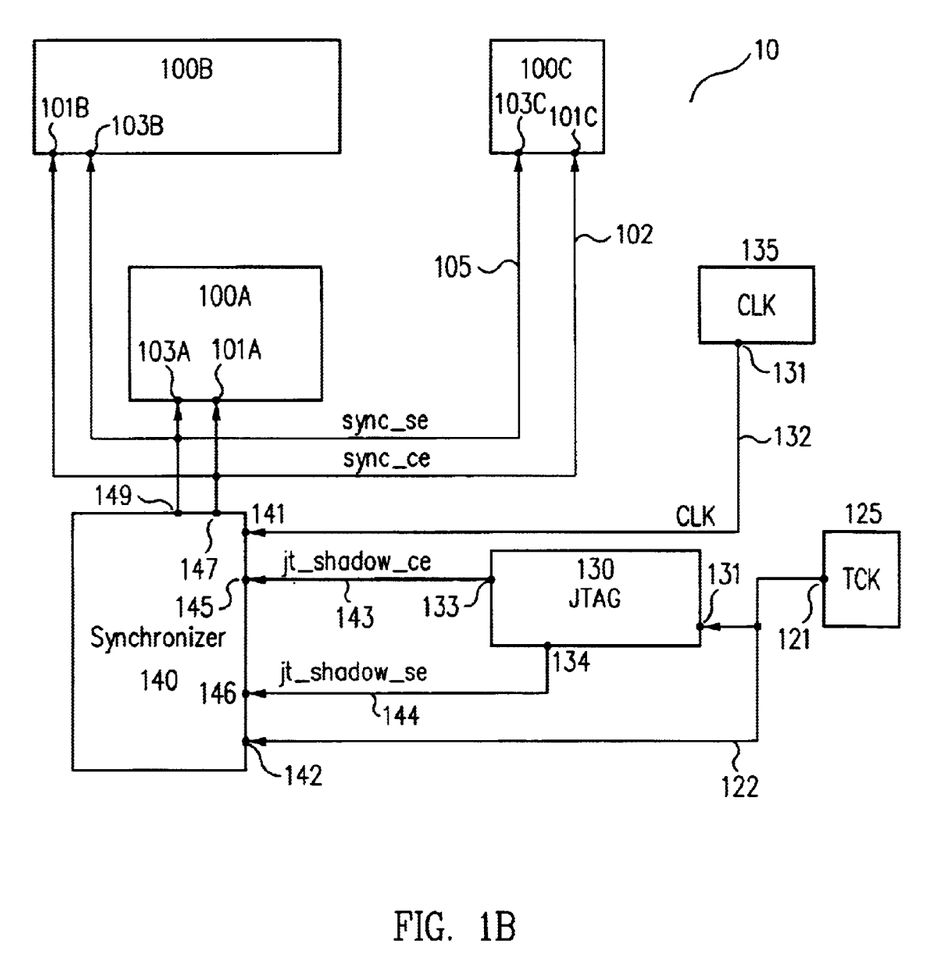
FIG. 1B is a block diagram of a system consistent with the present invention.

In accordance with the present invention, shadow storage elements 155 and 160 duplicate or "shadow" the information in the core logic's primary storage elements 115 and 120. As discussed above, shadow storage elements 155 and 160 are then coupled together with so output 159 connected to si input 162 to form a separate, independently-addressable shadow scan path 150. The information contained in primary storage elements 115 and 120 is then scanned out via the shadow scan path 150 without altering primary storage elements 115 and 120 in primary scan path 110. According to the invention, and in contrast to the prior art methods discussed above, this is done without interrupting, or in any way disturbing, the normal circuit operation of primary storage elements 115 and 120 using special commands issued by JTAG controller 130 (FIG. 1B). Thus, the shadow scan system of the invention allows a circuit to remain operational while a snapshot of the core logic information is scanned out.

As discussed above, and in more detail below, the apparatus of the present invention allows for access to the internal states of the microprocessor while the microprocessor continues to operate in a system. This is accomplished by capturing the contents of the functional primary storage elements 115, 120 into the shadow storage elements 155, 160 and then shifting the captured value out of the microprocessor without interrupting normal circuit operation. This is in direct contrast to prior art methods which either tested only at the boundaries, i.e., at the inputs and outputs of the circuit, or that required the microprocessor to be run in a special test mode. In addition, using the structure of the invention, real operating data is obtained from the microprocessor or circuit. This is also in direct contrast to the prior art methods where only data from special test mode operations could be obtained. Consequently, using the structure of the invention, more accurate and realistic test data is provided.

The structure of the present invention uses the JTAG standard and takes advantage of the separate JTAG clock (TCK) to manipulate the capture and shift operations of the shadow scan path 150 using specially designed JTAG signals.

FIG. 1B is a block diagram of a system 10 consistent with the present invention. System 10 includes: a system or central processing unit "CPU" clock, referred to herein as "CLK 135"; a JTAG clock, referred to herein as "TCK 125"; a JTAG controller 130; a block of one or more synchronizer circuits, referred to herein as "synchronizer 140"; and functional units 100A, 100B and 100C.

As shown in FIG. 1B, CLK 135 has an output terminal 131 coupled to CLK input terminal 141 of synchronizer 140 by line 132. TCK 125 has an output terminal 121 coupled to input terminal 131 of JTAG controller 130 by line 122 and input terminal 142 of synchronizer 140 by line 122.

In addition, according to the invention, JTAG controller 130 has a shadow_ce output terminal 133 coupled to a shadow_ce input terminal 145 of synchronizer 140 by line 143. According to the invention, JTAG controller 130 also has a shadow_se output terminal 134 coupled to a shadow_se input terminal 146 of synchronizer 140 by line 144. JTAG controller shadow_ce output terminal 133, synchronizer shadow_ce input terminal 145, JTAG controller shadow_se output terminal 134, synchronizer shadow_se input terminal 146, as well as the signals jt shadow_ce and jt shadow_se generated on lines 143 and 144, will be discussed in more detail below.

As also shown in FIG. 1B, synchronizer 140 includes a sync_ce output terminal 147 and a sync_se output terminal 149. Synchronizer 140 sync_ce output terminal 147 is coupled to: sync_ce input terminal 101A of functional unit 100A; sync_ce input terminal 101B of functional unit 100B; and sync_ce input terminal 101C of functional unit 100C by line 102. Synchronizer 140 sync_se output terminal 149 is coupled to: sync_se input terminal 103A of functional unit 100A; sync_se input terminal 103B of functional unit 100B; and sync_se input terminal 103C of functional unit 100C by line 105. Synchronizer sync_ce output terminal 147; synchronizer sync_se output terminal 149, as well as signals sync_ce and sync_se on lines 102 and 105 are discussed in more detail below.

Functional units 100A, 100B and 100C are representative of any functional units used in microprocessor's and well known to those of skill in the art. In one embodiment of the invention, functional units 100A, 100B and 100C are instruction units (IUs). In another embodiment of the invention, functional units 100A, 100B and 100C are external memory units (EMUs). In another embodiment of the invention, functional units 100A, 100B and 100C are arithmetic logic units (ALUs) or floating-point units (FPUs). In yet another embodiment of the invention, functional units 100A, 100B and 100C are a mix of IUs, EMUs, ALUs and/or FPUs. It should also be noted here that for simplicity only three functional units 100A, 100B, 100C are shown in FIG. 1B. However, those of skill in the art will recognize that any number of functional units desired can be accommodated using the method and structure of the invention.

CLK 135 is one of numerous system clocks well known in the art that can have virtually infinite frequencies ranging, at the time of this application, from megahertz to gigahertz. As mentioned, system clocks such as CLK 135 are well known in the art and therefore will not be discussed in further detail in order to avoid detracting from the present invention.

TCK 125 is the external clock required by the JTAG standard and well known to those of skill in the art. TCK 125 typically operates at a frequency that is much lower than CLK 135. For instance, as one example, CLK 135 may operate at a frequency of one gigahertz while TCK 125 operates at a frequency of ten megahertz. As with CLK 135, TCK 125 is well known in the art and therefore will not be discussed in further detail in order to avoid detracting from the present invention.

JTAG controller 130 is well defined in the JTAG standard and preferably issues commands to either primary storage elements 115, 120 (FIG. 1A) or shadow storage elements 155, 160 of functional units 100A, 100B and 100C via synchronizer 140 (FIG. 1B). These commands may include a Scan In (si) signal, a scan enable (se) signal, or a clock-enable (ce) signal, respectively.

In addition, according to the present invention, JTAG controller 130 issues customized command signals, jt shadow_ce and jt shadow_se, shadow storage elements 155, 160 of functional units 100A, 100B and 100C through synchronizer 140 (FIG. 1B).

JTAG controller 130 and it's normal operation is well known to those of skill in the art and therefore will not be discussed in further detail here in order to avoid detracting from the present invention. Special command signals jt shadow_ce and jt shadow_se, associated with the present invention, will be discussed in more detail below.

As discussed above, CLK 135 and TCK 125 operate at different frequencies and often this difference in frequency is an order of magnitude or more. This creates two significant problems. First, the core logic's primary storage elements 115, 120 (FIG. 1A) are driven by CLK 135 whose signal is not synchronized with the signal from TCK 125. As discussed above, CLK 135 typically operates at a much higher speed than does TCK 125. If the signals from the two clocks, CLK 135 and TCK 125, are not synchronized, the shadow scan path 150 (FIG. 1A) of the present invention will not work and there is a chance that the circuit or microprocessor may be damaged. Second, TCK 125 is not skew-controlled, which could result in races and meta-stability between the shadow storage elements 155, 160 (FIG. 1A) of the present invention.

There exists, therefore, a need to synchronize the external clock signal from TCK 125 used to drive shadow storage elements 155, 160 with the system clock signal from CLK 135 used by the circuit's primary storage elements 115, 120, and to control skewing of the external clock signal from TCK 125.

This function is performed by Synchronizer 140 in FIG. 1B. In one embodiment of the invention, synchronizer 140 is of the type set forth in the commonly assigned patent application Ser. No. 09/204,557 of Arthur T. Leung and Dale Greenley entitled "METHODS AND APPARATUS FOR SYNCHRONIZING ASYNCHRONOUS TEST STRUCTURES AND ELIMINATING CLOCK SKEW CONSIDERATIONS" filed Dec. 3, 1998 which is incorporated herein, in it's entirety, by reference (hereinafter referred to as the Leung reference).

Methods and apparatus consistent with the Leung reference provide a way to drive a shadow storage element at an external clock rate that is synchronized with the system clock and that does not suffer from clock skew problems. Clock skew problems are eliminated by using the skew-controlled system clock CLK signal as the clock input of the shadow storage element. This obviates the need for a separate, skew-controlled JTAG TCK signal. Furthermore, the shadow storage element is synchronized with the system clock signal from CLK 135 and operates at the frequency of the JTAG TCK signal.

More specifically, in one embodiment of the invention, synchronizer 140 receives a signal from TCK 125 at TCK input 142 and then yields output signals sync_se and sync_ce at outputs 147 and 149, respectively, that are synchronized with the system clock CLK 135, but operate at the frequency of the external signal from TCK 125. As discussed in more detail below with respect to FIG. 2, in one embodiment of the invention, the sync_ce signal from synchronizer 140 is coupled to a shadow staging element, and the clock enable (ce) inputs of shadow storage elements 155 and 160. The system clock signal from CLK 135 is then coupled into the clock inputs 196 and 198 of shadow storage elements 155 and 160 (See FIG. 2). Since the clock-enable signal triggers shadow storage elements 155 and 160, shadow storage elements 155 and 160 are driven at the external signal frequency from TCK 125. Clock skew is thus eliminated because the system clock CLK 135 used for the clock input to the primary and shadow storage elements 115, 120, 155 and 160 is skew-controlled.

Figure 2:
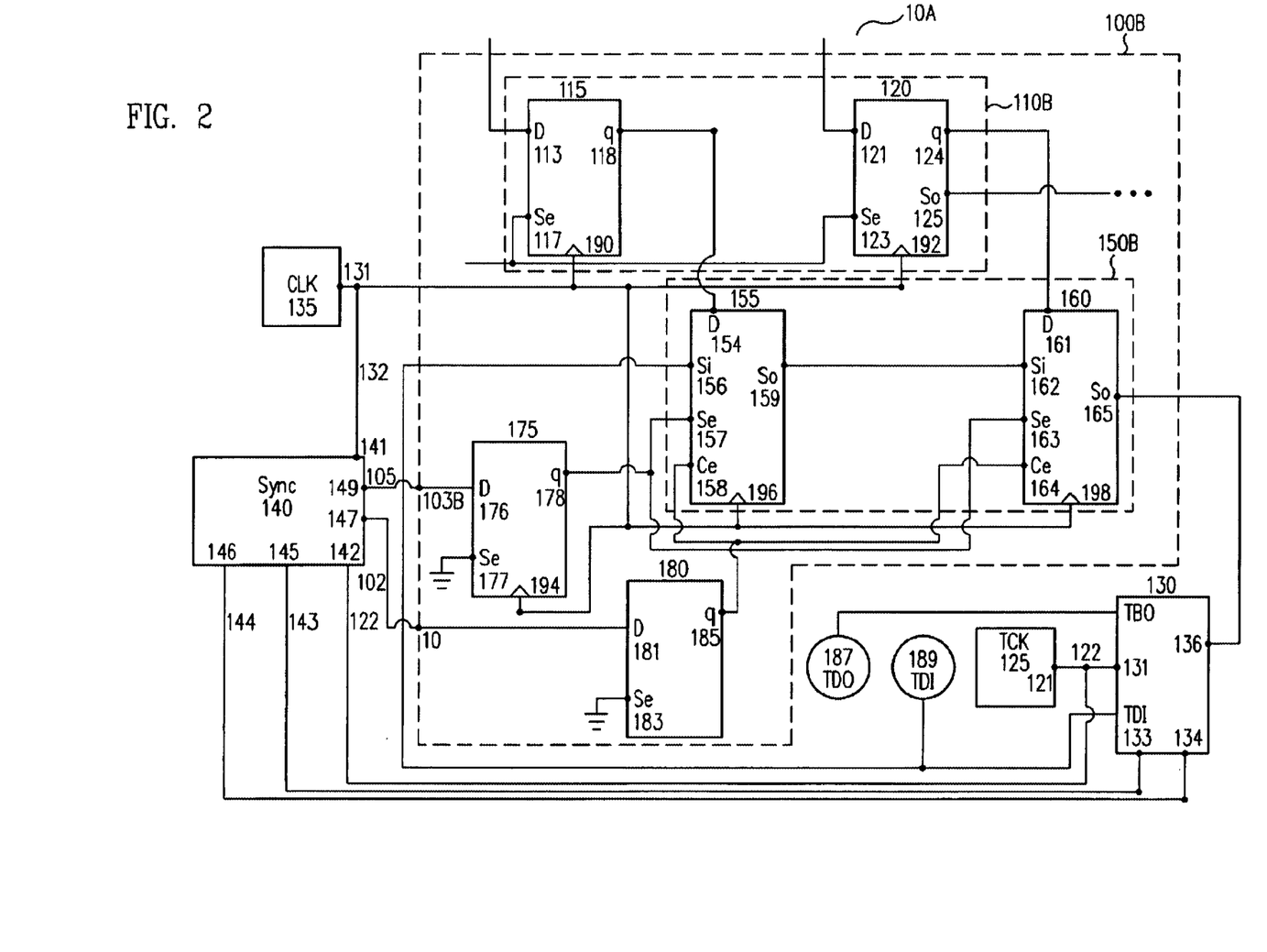
FIG. 2 is a block diagram depicting a system consistent with the invention, similar to the system of FIG. 1B, in more detail.

FIG. 2 is a block diagram depicting a system 10A that is consistent with the invention and the Leung reference.

System 10A comprises: exemplary functional unit 100B from FIG. 1B with primary scan path 110B and a shadow scan path 150B; synchronizer 140; CLK 135; TCK 125; Test Data In (TDI) unit 189; Test Data Out (TDO) unit 187 and JTAG controller 130. In one embodiment of the invention, primary scan path 110B of functional unit 100B comprises primary storage elements 115 and 120 and shadow scan path 150B of functional unit 100B comprises shadow storage elements 155 and 160, as well as shadow staging elements 175 and 180. As with system 10 in FIG. 1B, system 10A is interfaced to CLK 135 and JTAG controller 130.

In the following discussion, functional unit 100B of FIG. 1B was chosen to discuss. However, those of skill in the art will recognize that functional units 100A or 100C of FIG. 1B, or any functional unit, could have been chosen for discussion. Functional unit 100B was simply chosen as an exemplary functional unit and the implementation of the invention in any other function unit would be substantially the same as discussed below.

As discussed above with regard to FIG. 1A, primary storage elements 115 and 120 store data used by the circuit core logic and shadow storage elements 155 and 160 store data either from primary storage elements 155, 120 or from a preceding shadow storage element in the chain. In one embodiment of the invention, primary storage elements 115 and 120 are edge-triggered flip-flops with a data input ("d") and a clock input ("CK"), such as D-type flip-flops. In one embodiment of the invention, shadow storage elements 155 and 160 are edge-triggered flip-flops with two data inputs, a Select ("se") input, a clock-enable ("CE") input, and a clock input ("CK"), such as mux-2 D-type flip flops with clock enable.

As also discussed above with respect to FIG. 1A, shadow storage elements 155, 160 receive data from primary storage elements 115, 120 via "d" inputs 154 and 161, respectively, and receive data from preceding shadow storage elements via "si" inputs 162.

In one embodiment of the invention, terminal TDI of JTAG controller 130 is connected to Test Data In unit 189 and si input 156 of shadow storage element 155. Terminal TDO of JTAG controller 130 is connected to Test Data Out unit 187. As in the embodiment of the invention discussed above with respect to FIG. 1B, JTAG controller 130 has a shadow_ce output terminal 133 coupled to a shadow_ce input terminal 145 of synchronizer 140 by line 143. JTAG controller 130 also has a shadow_se output terminal 134 coupled to a shadow_se input terminal 146 of synchronizer 140 by line 144.

Synchronizer 140 includes a sync_ce output terminal 147 and a sync_se output terminal 149. Synchronizer 140 sync_ce output terminal 147 is coupled to sync_ce input terminal 101B of functional unit 100B by line 102. In one embodiment of the invention, input terminal 101B of functional unit 100B is coupled to "d" input terminal 181 of shadow staging element 180. Synchronizer 140 sync_se output terminal 149 is coupled to sync_se input terminal 103B of functional unit 100B by line 105. In one embodiment of the invention, input terminal 103B of functional unit 100B is coupled to "d" input terminal 176 of shadow staging element 175.

As also shown in FIG. 2, in one embodiment of the invention, CLK 135 has an output terminal 131 coupled to CLK input terminal 141 of synchronizer 140 by line 132. TCK 125 has an output terminal 121 coupled to input terminal 131 of JTAG controller 130 by line 122 and input terminal 142 of synchronizer 140 by line 122.

In one embodiment of the invention, the "d" inputs 154 and 161 of shadow storage elements 155 and 160, respectively, are coupled to the "q" data outputs 118 and 124 of primary storage elements 115 and 120, respectively, and the "si" input 162 of shadow storage element 160 is coupled to the "so" data output 159 of shadow storage element 155 to form shadow scan path 150B. The "so" data output of the last shadow storage element in shadow scan path 150, i.e., output 165 of shadow storage element 160 in FIG. 2, is coupled to JTAG controller 130 at terminal 136.

In one embodiment of the invention, CLK 135 is coupled to the clock inputs 190 and 192 of primary storage elements 115 and 120, respectively, and clock inputs 196 and 198 of shadow storage elements 155 and 160, respectively.

In one embodiment of the invention, a "q" output terminal 178 of shadow staging element 175 is coupled to the se input terminal 157 of shadow storage element 155 and se input terminal 163 of shadow storage element 160. A "q" output terminal 185 of shadow staging element 180 is coupled to the ce input terminal 158 of shadow storage element 155 and ce input terminal 164 of shadow storage element 160.

As discussed above, JTAG controller 130 is well defined in the JTAG standard and issues commands to either primary storage elements 115, 120 or shadow storage elements 155, 160 via synchronizer 140. These commands include a Scan In (si) signal, a Select Enable (se) signal, or a Clock Enable (ce) signal, respectively, that are activated by issuing instructions designed specifically for these operations.

In addition, according to the present invention, special customized command signals jt shadow_ce and jt shadow_se are generated by JTAG controller 130. As discussed above, signal jt shadow_ce is coupled from output terminal 133 of JTAG controller 130 to input terminal 145 of synchronizer 140 by line 143 and signal jt shadow_se is coupled from output terminal 134 of JTAG controller 130 to input terminal 146 of synchronizer 140 by line 144. Signals sync_se and sync_ce are then generated by synchronizer 140 at output terminals 149 and 147, respectively.

As discussed above, in one embodiment of the invention, output terminal 147 from synchronizer 140 is coupled to the data "d" input 181 of shadow staging element 180 and output terminal 149 from synchronizer 140 is coupled to the data "d" input 176 of shadow staging element 175.

As discussed above, CLK 135 outputs a skew-controlled clock signal that is used by many components of the system, such as the logic elements of the core logic. Synchronizer 140 receives inputs from CLK 135 and JTAG controller 130, and provides output signals sync_se and sync_ce that are synchronized to CLK 135 and operate at the frequency of the signal from JTAG controller 130.

Figure 3:
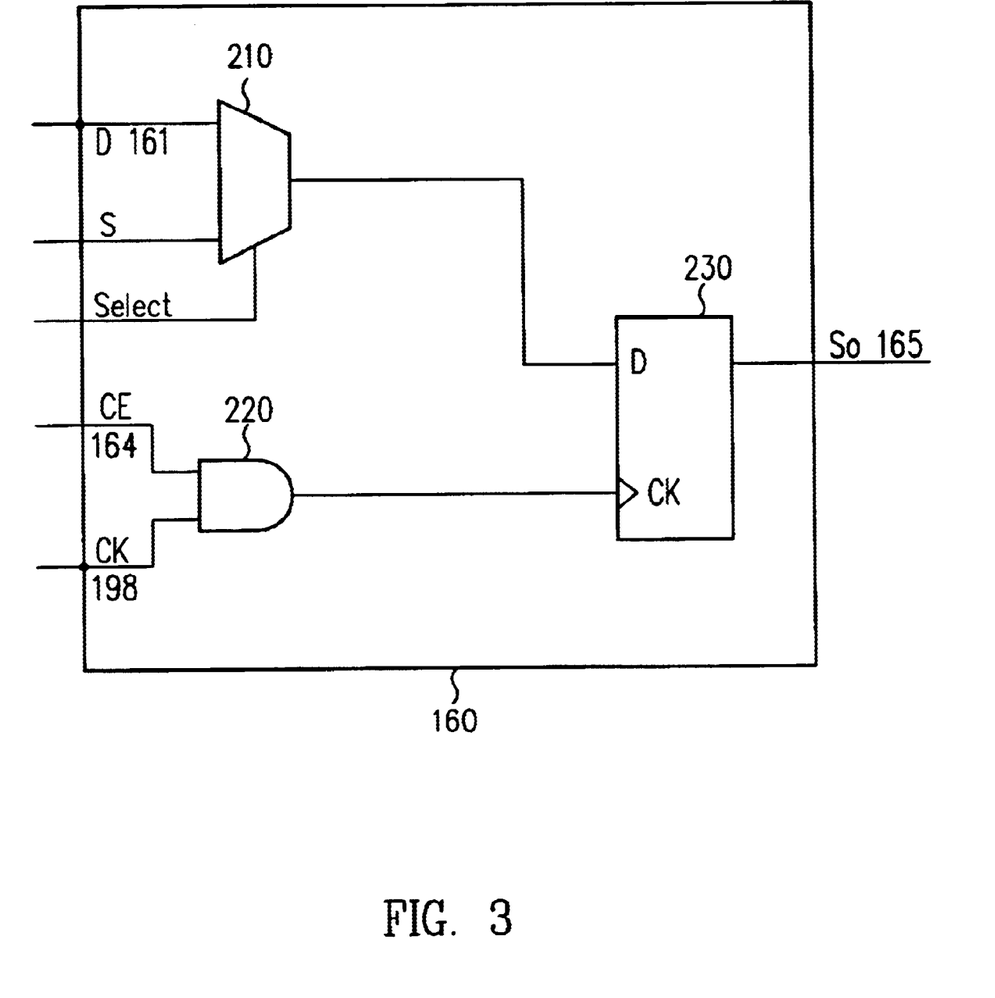
FIG. 3 is a block diagram depicting a detailed view of one implementation of shadow storage element.

FIG. 3 is a block diagram depicting a detailed view of one implementation of shadow storage element 160 suitable for use with the present invention. In the following discussion, shadow storage element 160 of FIG. 1A and FIG. 2 was chosen to discuss. However, those of skill in the art will recognize that shadow storage element 155 of FIG. 1A and FIG. 2, or any shadow storage element, could have been chosen for discussion. Shadow storage element 160 was simply chosen as an exemplary shadow storage element and the implementation of the invention in any other shadow storage element would be substantially the same as discussed below.

In one embodiment of the invention, shadow storage element 160 is an edge-triggered flip flop with clock enable, such as a mux-2 flip-flop with clock enable. In one embodiment of the invention, shadow storage element 160 preferably contains a multiplexor 210, an AND gate 220, and a D-type flip-flop 230.

Multiplexor 210 has a "d" input coupled to "d" input terminal 161, a "si" input coupled to "si" input terminal 162, a "se" input coupled to "se" input terminal 163, and a "so" output coupled to "so" output terminal 165. Flip-flop 230 has a D input connected to the output of multiplexor 210, a clock input, and an output. AND gate 220 has first and second inputs, and an output connected to the clock input of flip-flop 230.

In one embodiment of the invention, Multiplexor 210 is used to select, as an input to flip-flop 230, either data from a primary storage element (e.g., from primary storage element 115 in FIG. 1A and FIG. 2) or data from a preceding shadow storage element in shadow scan path 150 (e.g., from shadow storage element 155 in FIG. 1A and FIG. 2).

Figure 4:
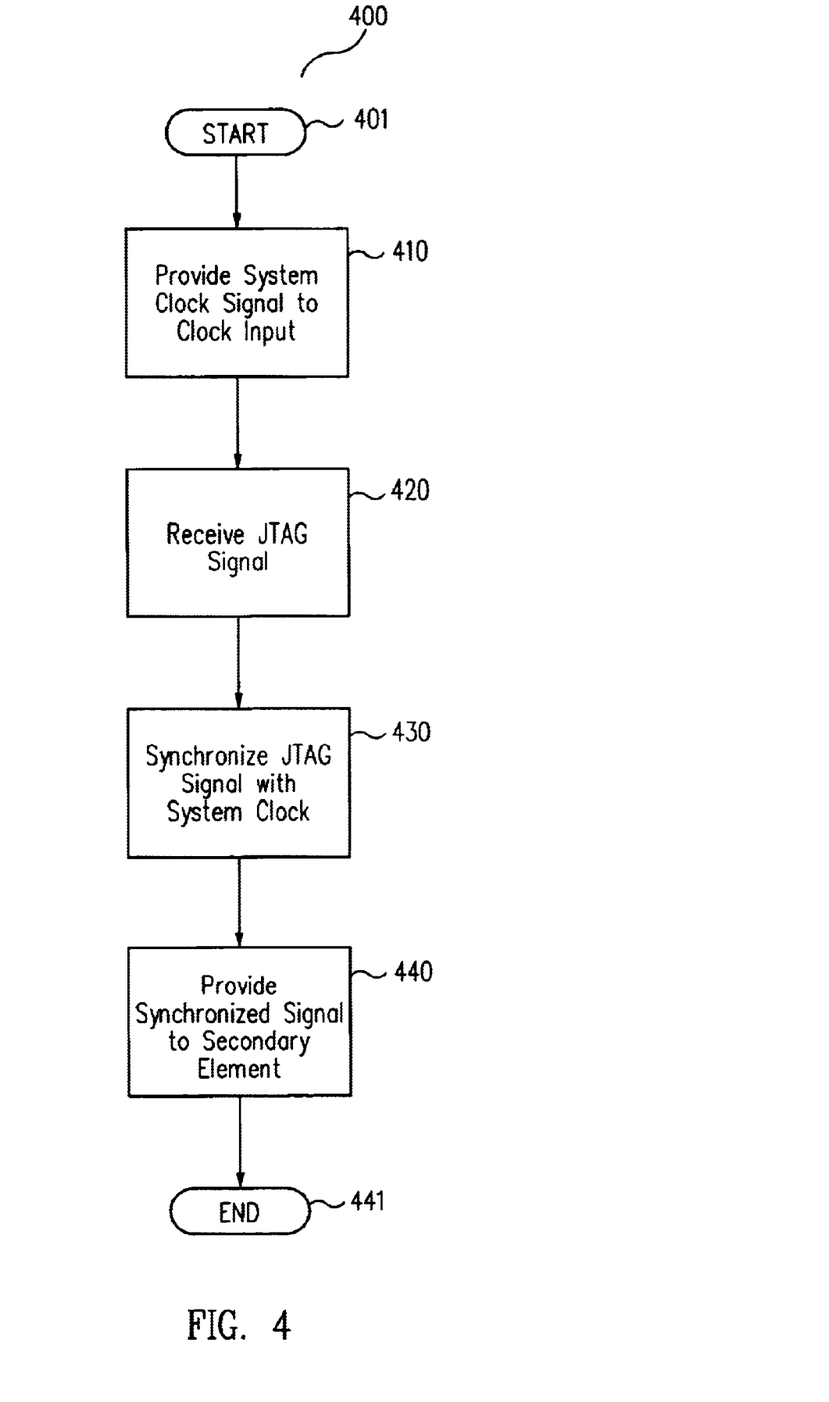
FIG. 4 is a flow diagram of a method of synchronizing an external clock TCK to a system clock CLK and controlling skew associated with the external clock in accordance with one embodiment of the invention.

FIG. 4 is a flow diagram of a method 400 for synchronizing the JTAG clock TCK to system clock CLK and controlling skew associated with TCK. FIG. 4 is described with reference to system 10A shown in FIG. 2.

The process begins at step 401. At step 410, the system clock signal from CLK 135, which is skew-controlled, is provided to clock inputs 196, 198, respectively, of shadow storage elements 155 and 160.

At step 420, JTAG controller 130 generates a signal. The signal may be, for example, a signal to scan in data to the first shadow storage element in the chain, a signal to sample data from a preceding shadow storage element, or a signal to enable a shadow storage element.

At step 430, system 10A synchronizes the signal from JTAG controller 130 with CLK 135 by using synchronizer 140. In one embodiment of the invention, if the signal from JTAG controller 130 is signal jt_shadow_ce or jt_shadow_se, system 10A synchronizes the signal with system clock signal from CLK 135 by using synchronizer 140.

At step 440, the synchronized signal output from synchronizer 140 is provided as an input to a shadow storage element, such as shadow storage elements 155, 160. If the synchronized signal from JTAG controller 130 is signal sync_se, the signal is provided to the se inputs 157, 163 of shadow storage elements 155, 160, respectively. If the synchronized signal from JTAG controller 130 is signal sync_ce, the signal is provided to the ce inputs 158, 164 of shadow storage elements 155, 160, respectively. At step 441 the process ends.

The process described above with reference to FIG. 4 and FIG. 2 eliminates clock skew by using the skew-controlled system clock CLK 135 signal as the clock input 196, 198 of shadow storage elements 155 and 160, respectively (FIG. 2). This obviates the need for a separate, skew-controlled TCK 125 or JTAG signal. Furthermore, the process described above synchronizes shadow storage elements 155 and 160 with the system clock signal from CLK 135 and operates at the frequency of the TCK 125 or JTAG signal.

Using the Leung reference's implementation of the synchronizer 140 with system 10 of FIG. 1B and system 10A of FIG. 22, JTAG controller 130 asserts a signal jt_shadow_ce for one TCK 125 cycle on line 143 to input 145 of synchronizer 140 (FIG. 1B). Synchronizer 140 then takes the TCK 125 domain signal and generates a sync_ce pulse for one cycle of CLK 135 at output 141 on line 102. The sync_ce pulse enables the functional data at the "d" inputs 113 and 121 of primary storage elements 115 and 120, respectively, to be sampled by shadow storage elements 155 and 160 at inputs 154 and 161, respectively (FIG. 2). JTAG controller 130 then asserts a signal jt_shadow_se and holds this signal high or at a digital one "1" during the shift operation. In an operation similar to the jt_shadow_ce discussion above, the jt_shadow_se signal is asserted for one TCK 125 cycle on line 144 to input 146 of synchronizer 140 (FIG. 1B). Synchronizer 140 then takes the TCK 125 domain signal and generates a sync_se pulse for one cycle of CLK 135 at output 149 on line 105.

Figure 5:
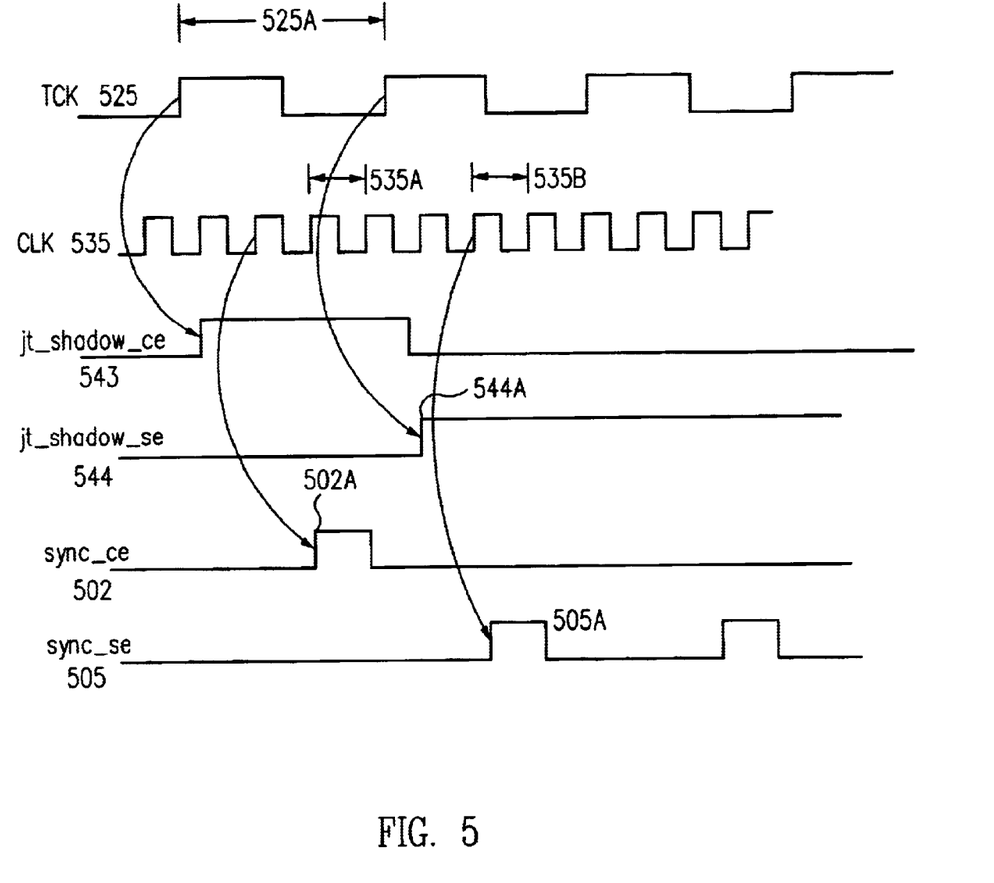
FIG. 5 is a timing diagram depicting signals associated with the system of FIG. 1B and FIG. 2 in accordance with the principles of the invention.

FIG. 5 is a timing diagram depicting the signals associated with system 10 of FIG. 1B and system 10A of FIG. 2 in accordance with the principles of the invention. FIG. 5 shows: signal TCK 525 from TCK 125 in FIGS. 1B and 2; signal CLK 535 from CLK 135 in FIGS. 1B and 2; signal jt_shadow_ce 543 from terminal 133 of JTAG controller 130 in FIGS. 1B and 2; signal jt_shadow_se 544 from terminal 134 of JTAG controller 130 in FIGS. 1B and 2; signal sync_ce 502 from terminal 147 of synchronizer 140 in FIGS. 1B and 2; and signal sync_se 505 from terminal 149 of synchronizer 140 in FIGS. 1B and 2.

As discussed above, using synchronizer 140 with system 10 of FIG. 1B and system 10A of FIG. 2A, JTAG controller 130 asserts a signal jt_shadow_ce 543 for one cycle 525A of signal TCK 525 from TCK 125. Synchronizer 140 then takes the signal jt_shadow_ce 543 and generates a sync_ce pulse 502A for one cycle 535A of signal CLK 535 from CLK 135. Sync_ce pulse 502A enables the functional data at the "d" inputs 113 and 121 of primary storage elements 115 and 120, respectively, to be sampled by shadow storage elements 155 and 160 at inputs 154 and 161, respectively (FIG. 2). JTAG controller 130 then drives signal jt_shadow_se 544 (FIG. 6) to high 544A and holds jt_shadow_se 544 at high 544A during the shift operation.

In an operation similar to the signal jt_shadow_ce 543 discussion above, signal jt_shadow_se is asserted on line 144 to input 146 of synchronizer 140 (FIGS. 1B and 2). Synchronizer 140 then generates a sync_se pulse 505A for one cycle 535B of signal CLK 535 from CLK 135.

As shown above, the apparatus of the present invention allows for access to the internal states of the microprocessor to debug the microprocessor while the microprocessor continues to operate in a system. This is accomplished by capturing the contents of the functional primary storage elements into the shadow storage elements and then shifting the captured value out of the microprocessor without interrupting normal circuit operation. This is in direct contrast to prior art methods, which either tested only at the boundaries, i.e., at the inputs and outputs of the microprocessor, or that, required the microprocessor to run in a special test mode. In addition, using the structure of the invention, real operating data is obtained from the microprocessor. This is also in direct contrast to the prior art methods where only data from special test mode operation could be obtained. Consequently, using the structure of the invention, more accurate and realistic test data is provided.

As shown above, the structure of the present invention uses the JTAG standard and takes advantage of the separate JTAG clock (TCK) to manipulate the capture and shift operations of the shadow scan path using specially designed JTAG signals. In addition, using the method and structure of the invention, the shadow scan paths are not part of the microprocessor internal scan chain.

The foregoing description of an implementation of the invention has been presented for purposes of illustration and description, and therefore is not exhaustive and does not limit the invention to the precise form disclosed. Modifications and variations are possible in light of the above teachings or may be acquired from practicing the invention. For example, the description above is based on the JTAG standard, but it may be used with other standards. The scope of the invention is defined by the claims and their equivalents.

What is claimed is:

1. A processor, said processor comprising:
   a synchronizer, said synchronizer generating a signal "sync_ce" at a synchronizer first output terminal and a signal "sync_se" at a synchronizer second output terminal, said synchronizer having a synchronizer first input terminal, a synchronizer second input terminal; a synchronizer third input terminal and a synchronizer fourth input terminal;

a system clock, said system clock generating a signal "CLK" with a first frequency at a system clock first output terminal, said system clock first output terminal being coupled to said synchronizer third input terminal;

a JTAG controller, said JTAG controller having a JTAG controller first input terminal, said JTAG controller generating a signal "jt-shadow_ce" at a JTAG controller first output terminal and a signal "jt_shadow_se" at a JTAG controller second output terminal, said JTAG controller first output terminal being coupled to said synchronizer first input terminal and said JTAG controller second output terminal being coupled to said synchronizer second input terminal;

a JTAG clock, said JTAG clock generating a signal "TCK" with a second frequency at a JTAG clock first output terminal, said JTAG clock first output terminal being coupled to said synchronizer fourth input terminal;

at least one functional unit, said functional unit having a functional unit first input terminal and a functional unit second input terminal, said synchronizer first output terminal being coupled to said functional unit first input terminal and said synchronizer second output terminal being coupled to said functional unit second input terminal, said functional unit including:

a primary scan path; and a shadow scan path; wherein in response to said signals sync_ce and sync_se from said synchronizer, said shadow scan path receives data contained in said primary scan path and scans said data out of said functional unit for testing the operation of said processor while said processor continues its normal operations.

2. The processor of claim 1, wherein said primary scan path comprises at least one primary storage element and said shadow scan path comprises at least one shadow storage element.

3. The processor of claim 2, wherein said at least one primary storage element is a flip-flop having primary storage element "d" input and a primary storage element "q" output.

4. The processor of claim 3, wherein said at least one shadow storage element is a flip-flop having shadow storage element "d" input.

5. The processor of claim 4, wherein said primary storage element "q" output is coupled to said shadow storage element "d" input.

6. The processor of claim 1, wherein said primary scan path comprises at least two primary storage elements and said shadow scan path comprises at least two shadow storage elements.

7. The processor of claim 6, wherein said at least two primary storage elements are flip-flops each having a primary storage element "d" input, a primary storage element "si" input, a primary storage element "q" output and a primary storage element "so" output.

8. The processor of claim 7, wherein said at least two shadow storage elements are flip-flops each having a shadow storage element "d" input, a shadow storage element "si" input and a shadow storage element "so" output.

9. The processor of claim 8, wherein a first primary storage element of said at least two primary storage elements has a first primary storage element "q" output coupled to a first shadow storage element "d" input of a first shadow storage element of said at least two shadow storage elements and a second primary storage element of said at least two primary storage elements has a second primary storage element "q" output coupled to a second shadow storage element "d" input of a second shadow storage element of said at least two shadow storage elements.

10. The processor of claim 9, wherein a first primary storage element "so" output of said first primary storage element is coupled to a second primary storage element "si" input of said second primary storage element thereby forming said primary scan path.

11. The processor of claim 10, wherein a first shadow storage element "so" output of said first shadow storage element is coupled to a second shadow storage element "si" input of said second shadow storage element thereby forming said shadow scan path.

12. The processor of claim 1 further comprising:

a first shadow staging element, said first shadow staging element being coupled between said functional unit first input terminal and said shadow scan path; and a second shadow staging element, said second shadow staging element being coupled between said functional unit second input terminal and said shadow scan path.

13. The processor of claim 12, wherein said primary scan path comprises at least two primary storage elements and said shadow scan path comprises at least two shadow storage elements.

14. The processor of claim 13, wherein:

said at least two shadow storage elements are flip-flops each having a shadow storage element "d" input, a shadow storage element "ce" input, and a shadow storage element "se" input;

said first shadow staging element is a flip-flop having a first shadow staging element "d" input and a first shadow staging element "q" output;

said second shadow staging element is a flip-flop having a second shadow staging element "d" input and a second shadow staging element "q" output;

said functional unit first input terminal is coupled to said first shadow staging element "d" input and said first shadow staging element "q" output is coupled to each of said shadow storage element "ce" inputs, said functional unit second input terminal is coupled to said second shadow staging element "d" input and said second shadow staging element "q" output is coupled to each of said shadow storage element "se" inputs.

15. The processor of claim 14, wherein said at least two primary storage elements are flip-flops each having a primary storage element "d" input, a primary storage element "si" input, a primary storage element "q" output and a primary storage element "so" output.

16. The processor of claim 15, wherein a first primary storage element of said at least two primary storage elements has a first primary storage element "q" output coupled to a first shadow storage element "d" input of a first shadow storage element of said at least two shadow storage elements and a second primary storage element of said at least two primary storage elements has a second primary storage element "q" output coupled to a second shadow storage element "d" input of a second shadow storage element of said at least two shadow storage elements.

17. The processor of claim 16, wherein a first primary storage element "so" output of said first primary storage element is coupled to a second primary storage element "si" input of said second primary storage element thereby forming said primary scan path.

18. The processor of claim 17, wherein a first shadow storage element "so" output of said first shadow storage element is coupled to a second shadow storage element "si" input of said second shadow storage element thereby forming said shadow scan path.

19. The processor of claim 12, wherein said primary scan path comprises at least one primary storage element and said shadow scan path comprises at least one shadow storage element.

20. The processor of claim 19, wherein said at least one primary storage element is a flip-flop having primary storage element "d" input and a primary storage element "q" output.

21. The processor of claim 19, wherein:

said at least one shadow storage element is a flip-flop having shadow storage element "d" input, a shadow storage element "ce" input, and a shadow storage element "se" input;

said first shadow staging element is a flip-flop having a first shadow staging element "d" input and a first shadow staging element "q" output;

said second shadow staging element is a flip-flop having a second shadow staging element "d" input and a second shadow staging element "q" output;

said functional unit first input terminal is coupled to said first shadow staging element "d" input, said first shadow staging element "q" output is coupled to said shadow storage element "ce" input, said functional unit second input terminal is coupled to said second shadow staging element "d" input, said second shadow staging element "q" output is coupled to said shadow storage element "se" input.

22. The processor of claim 21, wherein said primary storage element "p" output is coupled to said shadow storage element "d" input.

* * * * *